(12) United States Patent
Huang et al.

(10) Patent No.: US 9,095,083 B2
(45) Date of Patent: Jul. 28, 2015

(54) MANUFACTURING METHOD FOR MULTI-LAYER CIRCUIT BOARD

(71) Applicant: Unimicron Technology Corp., Taoyuan (TW)

(72) Inventors: Pei-Chang Huang, Taoyuan County (TW); Cheng-Po Yu, Taoyuan County (TW); Han-Pei Huang, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 71 days.

(21) Appl. No.: 14/074,655

(22) Filed: Nov. 7, 2013

(65) Prior Publication Data

US 2015/0125625 A1 May 7, 2015

(51) Int. Cl.

| B05D 5/12 | (2006.01) |
|---|---|
| H05K 3/46 | (2006.01) |
| H05K 3/00 | (2006.01) |
| H05K 3/10 | (2006.01) |
| H05K 3/40 | (2006.01) |
| B05D 7/00 | (2006.01) |
| H05K 3/12 | (2006.01) |
| H05K 1/02 | (2006.01) |
| H05K 3/24 | (2006.01) |
| H05K 1/11 | (2006.01) |
| C23C 18/16 | (2006.01) |

(52) U.S. Cl.
CPC ............... *H05K 3/4644* (2013.01); *B05D 7/50* (2013.01); *H05K 1/0298* (2013.01); *H05K 3/0047* (2013.01); *H05K 3/10* (2013.01); *H05K 3/12* (2013.01); *H05K 3/40* (2013.01); *H05K 3/46* (2013.01); *B05D 5/12* (2013.01); *C23C 18/165* (2013.01); *H05K 1/111* (2013.01); *H05K 3/244* (2013.01)

(58) Field of Classification Search
USPC .................................. 427/97.4, 554
See application file for complete search history.

(56) References Cited

U.S. PATENT DOCUMENTS

| 3,739,469 A * | 6/1973 | Dougherty, Jr. ................. 29/852 |
|---|---|---|
| 8,647,517 B2 * | 2/2014 | Yokai et al. .................... 216/13 |
| 2013/0168148 A1 * | 7/2013 | Kanai et al. ................... 174/262 |

FOREIGN PATENT DOCUMENTS

| TW | 484350 | 4/2002 |
|---|---|---|
| TW | I341161 | 4/2011 |

\* cited by examiner

*Primary Examiner* — Brian K Talbot
(74) *Attorney, Agent, or Firm* — Jianq Chyun IP Office

(57) ABSTRACT

A manufacturing method for a multi-layer circuit board includes the following steps. Firstly, a substrate having a first via penetrating the substrate is provided. Next, a patterned circuit layer is formed on a surface of the substrate by using the first via as an alignment target. The first patterned circuit layer includes a first concentric-circle pattern surrounding the first via. Next, a first stacking layer is formed on the surface. Then, a first through hole penetrating regions where a first concentric circle from the center of the concentric-circle pattern is orthogonally projected on the first stacking layer and the substrate is formed. Next, a second stacking layer is formed on the first stacking layer. Afterward, a second through hole penetrating regions where a second concentric circle from the center of the concentric-circle pattern is orthogonally projected on of the first, the second stacking layers and the substrate is formed.

14 Claims, 6 Drawing Sheets

MANUFACTURING METHOD FOR MULTI-LAYER CIRCUIT BOARD

BACKGROUND OF THE INVENTION

1. Field of the Invention

The invention relates to a manufacturing method for a circuit board, and particularly relates to a manufacturing method for a multi-layer circuit board.

2. Description of Related Art

As the integration of electronic products is increasingly improved, a circuit layer of a circuit board applied to the high-integration electronic products increases from single layer, double layer to 6 layers, 8 layers and even more than 10 layers, so as to mount more electronic components on a printed circuit board. Generally speaking, the most common manufacturing process for a circuit board is the lamination process. When the lamination process is used to manufacture the circuit board, an alignment accuracy between each circuit layer and insulating layer needs to be appropriately controlled. Therefore, in the manufacturing process of the circuit board, a plurality of alignment targets are usually formed in a previous stacking layer through a photolithography process. Then, after another layer is added, X ray is used to find the alignment targets of the previous layer, and a milling process is performed to form alignment targets for a subsequent process.

However, since the alignment targets in the previous stacking layer are formed through the photolithography process, the process itself already causes errors. When the milling process using X ray is performed, additional errors in the milling process also occur. Thus, alignment errors caused by the alignment targets of each layer continuously accumulate. If a number of circuit layers of the circuit board increases, the accumulated errors of the alignment targets also increase, resulting in an overly large deviation of an interlayer alignment accuracy that makes a design of conductive holes and bonding pads on bottom layers unable to be miniaturized.

SUMMARY OF THE INVENTION

The invention provides a manufacturing method for a multi-layer circuit board capable of improving an interlayer alignment accuracy of the multi-layer circuit board, increasing a wiring density of a circuit layer, making it possible that conductive holes and bonding pads on bottom layers are designed to be miniaturized owing to the alignment accuracy. Even a pattern design with a single-side alignment accuracy up to less than 50 µm may be achieved.

The invention provides a manufacturing method for a multi-layer circuit board, which includes the following steps. Firstly, a substrate having a first via penetrating the substrate is provided. Next, a patterned circuit layer is formed on a surface of the substrate by using the first via as an alignment target. The first patterned circuit layer includes a first concentric-circle pattern surrounding the first via. Next, a first stacking layer is formed on the surface and covers the first patterned circuit layer. The first stacking layer includes a first dielectric layer and a first circuit layer covering the first dielectric layer. Thereafter, a first through hole is formed. The first through hole penetrates regions where a first concentric circle from the center of the concentric-circle pattern is orthogonally projected on the first stacking layer and the substrate. Next, a second stacking layer is formed on the first stacking layer. The second stacking layer includes a second dielectric layer and a second circuit layer covering the second dielectric layer. Thereafter, a second through hole is formed. The second through hole penetrates regions where a second concentric circle from the center of the concentric-circle pattern is orthogonally projected on of the second stacking layer, the first stacking layer and the substrate.

Based on above, the manufacturing method for the multi-layer circuit board of the invention forms the concentric-circle pattern on the surface of the substrate at the innermost, then the concentric-circle pattern is used as the alignment target in each of the stacking layers to form the corresponding alignment through hole, and then the alignment through hole of each layer is used to perform the subsequent process of the corresponding stacking layer, such as using the alignment through hole as the reference for alignment to form the patterned circuit layer and conductive hole of each layer. Therefore, the manufacturing method of the invention can reduce accumulation of alignment error through layers, and further reduce layer deviation in the multi-layer circuit board. Therefore, the invention can indeed increase the alignment accuracy of the multi-layer circuit board and increase the wiring density of the circuit layer. In addition, the design of the conductive holes and the bonding pads can be miniaturized owing to the alignment accuracy. Even the pattern design with the single-side alignment accuracy up to less than 50 µm may be achieved.

To make the above features and advantages of the disclosure more comprehensible, several embodiments accompanied with drawings are described in detail as follows.

DESCRIPTION OF THE EMBODIMENTS

Figure 1A:
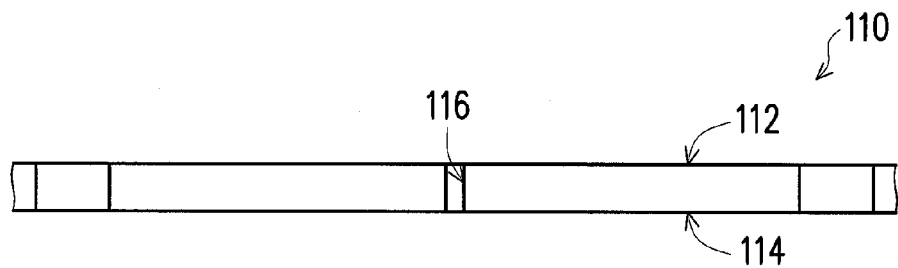
FIGS. 1A to 1G are schematic views illustrating a process flow of a manufacturing method for a multi-layer circuit board according to an embodiment of the invention.
Figure 1B:
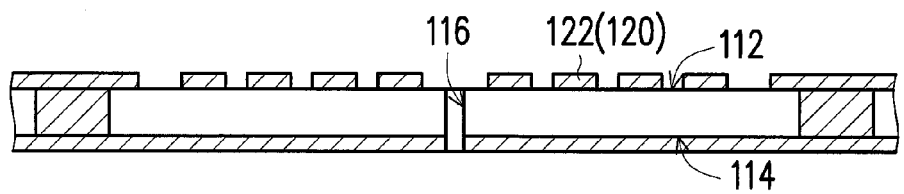

FIGS. 1A to 1G are schematic views illustrating a process flow of a manufacturing method for a multi-layer circuit board according to an embodiment of the invention. FIG. 2 is a schematic top view of a substrate and a first patterned circuit layer according to an embodiment of the invention. In the present embodiment, the manufacturing method for the multi-layer circuit board includes the following. First, as shown in FIG. 1A, a substrate 110 is provided. The substrate 110 includes two surfaces 112 and 114 opposite to each other and a first via 116 penetrating the substrate 110. Then, referring to FIG. 1B and FIG. 2 together, a first patterned circuit layer 120 is formed on the surface 112 by using the first via 116 as an alignment target. In the present embodiment, as shown in FIG. 2, an outer diameter D1 of the first via 116 substantially ranges between 0.5 mm and 0.8 mm. It should be noted that, a manufacturing process illustrated in FIG. 1A to FIG. 1G are cross-sectional views of a manufacturing process of the region A of FIG. 2. As shown in FIG. 2, the first patterned circuit layer 120 includes a first concentric-circle pattern 122 surrounding the first via 116. The first concentric-circle pattern 122 includes a plurality of concentric circles, and a gap G1 between each of the concentric circles substantially ranges between 50 μm and 100 μm. Of course, the invention is not limited thereto. Persons skilled in the art may make adjustments according to design and layout requirements of actual product.

Figure 1C:
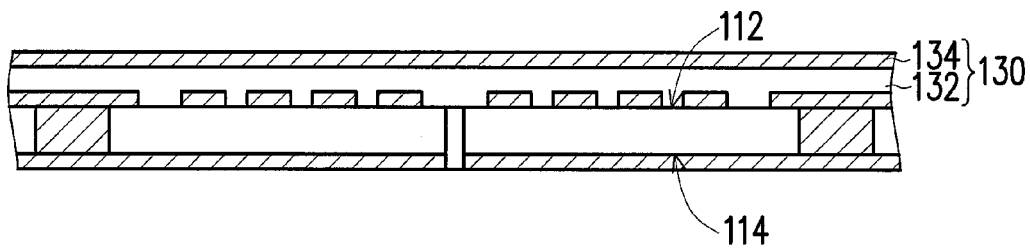
Figure 1D:
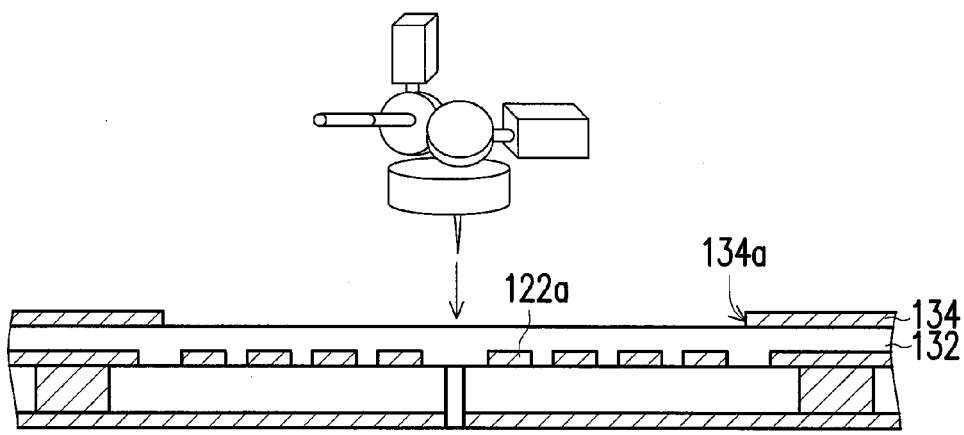
Figure 1E:
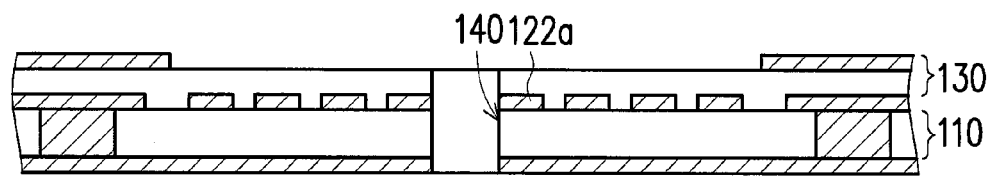
Figure 2:
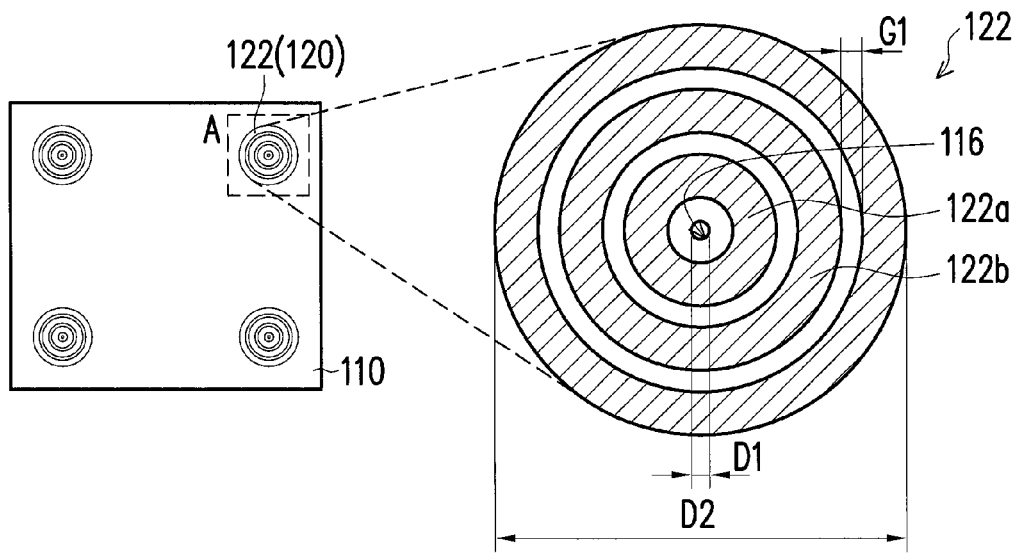
FIG. 2 is a schematic top view of a substrate and a first patterned circuit layer according to an embodiment of the invention.
Figure 3:
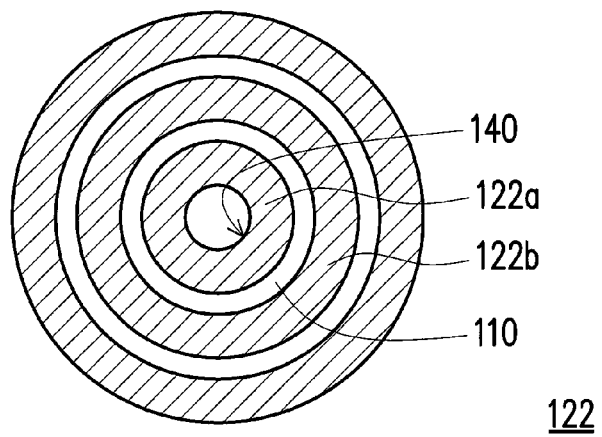
FIG. 3 is a schematic top view of the first concentric-circle pattern of FIG. 1E.

Next, as shown in FIG. 1C, a first stacking layer 130 is formed on the surface 112. Therein, the first stacking layer 130 includes a first dielectric layer 132 and a first circuit layer 134, and the first circuit 134 covers the first dielectric layer 132. Thereafter, referring to FIG. 1D and FIG. 1E together, a first through hole 140 is formed by using $CO_2$ laser drilling, for example. As shown in FIG. 1E, the first through hole 140 penetrates regions where an inner diameter of a first concentric circle 122a from a center of the first concentric-circle pattern 122 is orthogonally projected on the first stacking layer 130 and the substrate 110. FIG. 3 is a schematic top view of the first concentric-circle pattern 122 penetrated by the first through hole 140.

In the present embodiment, a material of the first patterned circuit layer 120 and the first circuit layer 134 is copper. Since copper only has a higher absorption rate in a short wavelength range with a wavelength shorter than the ultraviolet wavelength range (<0.3 μm), and the wavelength of $CO_2$ laser is longer (approximately longer than 10 μm), belonging to the infrared wavelength range, the $CO_2$ laser is less likely to be absorbed by copper and causes a hole due to ablation. Therefore, the concentric-circle pattern 122 made of copper may be considered as a copper mask for $CO_2$ laser, configured to limit a cutting range of $CO_2$ laser to the first stacking layer 130 and the substrate 110. Namely, when using $CO_2$ laser to drill outwardly from the center, the first through hole 140 is formed by drilling with the inner diameter of the first concentric circle 122a as a boundary. It should be noted that when $CO_2$ laser is used to form the first through hole 140, a first opening 134a as shown in FIG. 1D needs to be formed by patterning the first patterned circuit 134 as shown in FIG. 1C, such that the first opening 134a can expose a region where the first concentric-circle pattern 122 is orthogonally projected on the first dielectric layer 132 before proceeding to the subsequent drilling process.

Of course, the invention is not limited thereto. In other embodiments of the invention, a direct laser drilling (DLD) may also be used to form the first through hole 140. If the direct laser drilling is used to form the first through hole 140, it is not necessary to form the first opening 134a as shown in FIG. 1D. Instead, the laser drilling may be performed to form the first through hole 140 right after the first circuit layer 134 as shown in FIG. 1C is formed. In the present embodiment, the first through hole 140 may be formed by drilling from an outer surface of the first stacking layer 130 towards the substrate 110, for example.

Next, the first through hole 140 may serve as an alignment target to perform a subsequent process to the first stacking layer 130. For example, the first through hole 140 may serve as an alignment target in a photolithography process to pattern the first circuit layer 134, so as to form a second patterned circuit layer of the multi-layer circuit board. Or, the first through hole 140 may serve as an alignment target to form a first conductive hole on the first stacking layer 130.

Figure 1F:
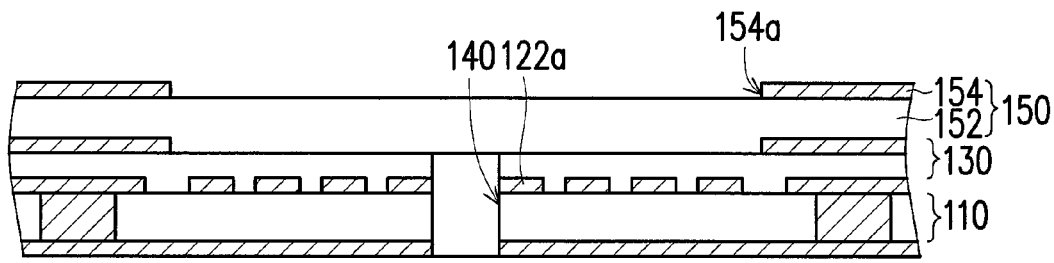
Figure 1G:
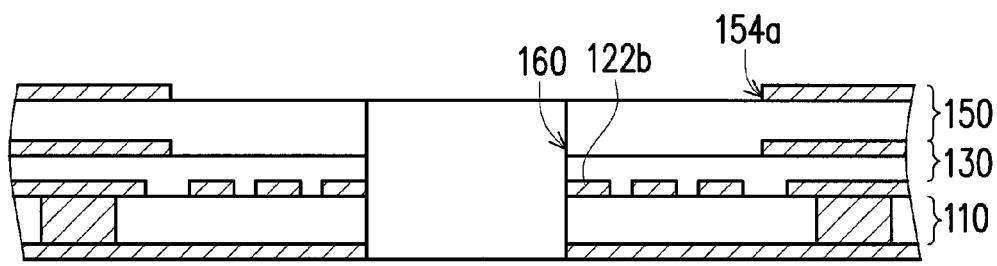
Figure 4:
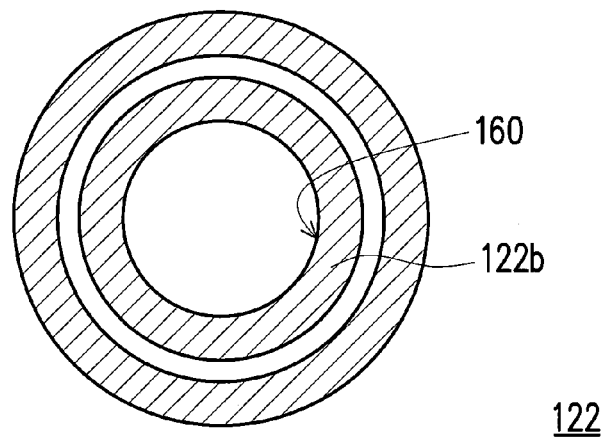
FIG. 4 is a schematic top view of the first concentric-circle pattern of FIG. 1G.

Next, as shown in FIG. 1F, a second stacking layer 150 is formed on the first stacking layer 130. The second stacking layer 150 includes a second dielectric layer 152 and a second circuit layer 154, and the second circuit 154 covers the second dielectric layer 152. Afterwards, as shown in FIG. 1G, a second through hole 160 is formed, and the second through hole 160 penetrates regions where an inner diameter of a second concentric circle 122b from the center of the first concentric-circle pattern 122 is orthogonally projected on the second stacking layer 150, the first stacking layer 130 and the substrate 110. FIG. 4 illustrates a schematic top view of the first concentric-circle pattern 122 penetrated by the second through hole 160.

Similar to formation of the first through hole, the second through hole 160 may also be formed by $CO_2$ laser drilling. Namely, by using $CO_2$ laser to drill outwardly from the center and remove a portion of the substrate 110 between the first concentric circle 122a and the second concentric circle 122b, as shown in FIG. 3, the first concentric circle 122a may be stripped from the concentric-circle pattern 122 to form the second through hole 160 as shown in FIG. 4. Similarly, in case $CO_2$ laser is used to form the second through hole 160, a second opening 154a as shown in FIG. 1F needs to be formed first, such that the second opening 154a can expose a region where the first concentric-circle pattern 122 is orthogonally projected on the second dielectric layer 152 before proceeding to the subsequent drilling process.

In other embodiments of the invention, the direct laser drilling (DLD) may also be used to form the second through hole 160. In this way, it is not necessary to form the second opening 154a as shown in FIG. 1F. Instead, the direct laser drilling may be directly performed to form the second through hole 160. In the present embodiment, the second through hole 160 may be formed by drilling from an outer surface of the second stacking layer 150 towards the substrate 110.

Next, the second through hole 160 may serve as an alignment target to perform a subsequent process to the second stacking layer 150. For example, the second through hole 160 may serve as an alignment target in a photolithography process to pattern the second circuit layer 154, so as to form a third patterned circuit layer of the multi-layer circuit board. Or, the second through hole 160 may serve as an alignment target to form a second conductive hole on the second stacking layer 150. Therein, the conductive hole connects the first conductive hole on the first stacking layer 130.

Even though this embodiment only describes a process flow of forming a two-layered stacking structure on one single side of the substrate, the invention imposes no limitation on numbers of stacking layers, circuit layers, and concentric circles of the concentric-circle pattern. Person skilled in the art may follow the manufacturing method described above to continue stack additional stacking layers on the second stacking layer, use the concentric-circle pattern 122 as an alignment target to form an alignment through hole of each layer, and perform a subsequent alignment process with the alignment through hole of each layer, so as to form a patterned circuit layer and/or a conductive hole of each layer.

In this way, each stacking layer of the multi-layer circuit board uses the concentric-circle pattern 122 on the surface of the substrate 110 at the innermost to form the corresponding alignment hole, accumulation of alignment error between layers in the conventional art may be reduced, and a layer deviation in the multi-layer circuit board may also be prevented. In addition, conductive holes connecting layers may be formed according to this method. Since the conductive hole of each layer is formed by using the concentric circle pattern 122 formed in the same photolithography process as the alignment target, a circumstance in which the alignment error, thus making the conductive hole of each layer unable to be aligned, is prevented, and a wiring density y of the circuit layer is improved. In addition, the conductive holes and bonding pads on bottom layers may be designed to be miniaturized, and a pattern design with a single-side alignment accuracy up to less than 50 µm may be achieved.

In addition, if a number of circuit layers required in the multi-layer circuit board is higher, a number of times for adding layers correspondingly increases. Consequently, a number of concentric circles of the first concentric-circle pattern 122 increases as well. Namely, a maximal outer diameter D2 of the first concentric-circle pattern 122 is positively proportional to the number of times for adding layers for the multi-layer circuit board. However, since an image-capturing window of a charge-coupled device (CCD) in a production equipment is limited by a maximum readable size, a maximum outer diameter D2 of the first concentric-circle pattern 122 is substantially less than or equal to 3.175 mm. Therefore, if the number of times of adding layers for the multi-layer circuit board exceeds a predetermined value (e.g., equal to or more than five), such that the maximum outer diameter D2 of the first concentric-circle pattern 122 is close to 3.175 mm, it then requires another concentric-circle pattern as the alignment target in the alignment process for a stacking layer formed thereafter.

Figure 5:
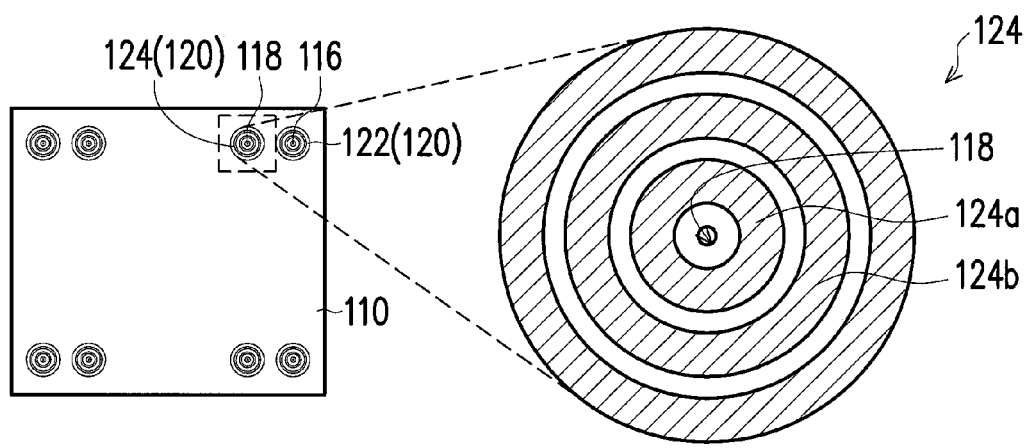
FIG. 5 is a schematic top view of a substrate and a first patterned circuit layer according to another embodiment of the invention.

FIG. 5 is a schematic top view of a substrate and a first patterned circuit layer according to another embodiment of the invention. FIGS. 6A to 6D are schematic views illustrating a partial process flow of a manufacturing method for a multi-layer circuit board according to another embodiment of the invention. Referring to FIG. 5, as described above, when the number of times of adding layers for the multi-layer circuit board exceeds a predetermined value, two concentric-circle patterns need to be designed. Namely, in this embodiment, the number of times of adding layers for the multi-layer circuit board exceeds the predetermined value (e.g., more than M times, and M is a positive integer greater than 2), and besides the first via 116, the substrate 110 can further include a second via 118 penetrating the substrate. Next, the first via 116 and the second via 118 are respectively used as the alignment targets, so that the first patterned circuit layer 120 can be respectively formed on the surface 112. Besides the first concentric-circle pattern 122 surrounding the first via 116, the first patterned circuit layer 120 also includes the second concentric-circle pattern 124 surrounding the second via 118. Since the first concentric-circle pattern 122 and the second concentric-circle pattern 124 are formed by using the same patterning process, thus accumulation of alignment error caused by a plurality of patterning processes can be prevented. Accordingly, the stacking layers started from a $M^{th}$ layer all use the second concentric-circle pattern 124 as an alignment target for the subsequent alignment process, and a manufacturing process thereof are substantially identical to FIG. 1A to FIG. 1G.

Figure 6A:
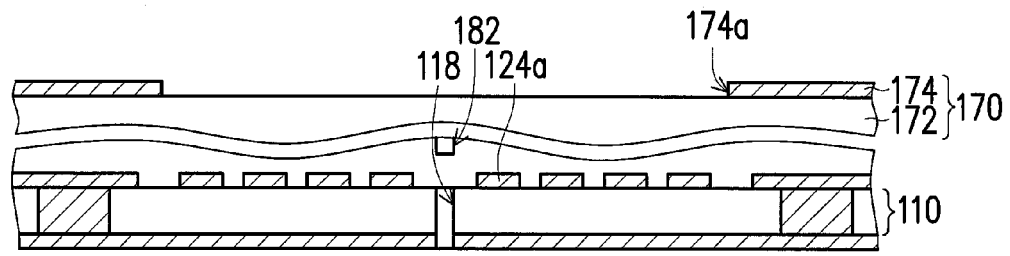
FIGS. 6A to 6D are schematic views illustrating a partial process flow of a manufacturing method for a multi-layer circuit board according to another embodiment of the invention.
Figure 6B:
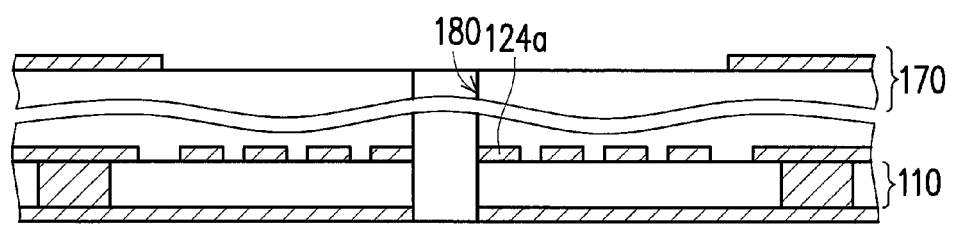

More specifically, referring to FIG. 5 and FIG. 6A together, a $M^{th}$ stacking layer can be formed on the second stacking layer 150 after the second concentric-circle pattern 124 is formed. In the present embodiment, M is, for example, 6. Namely, in the multi-layer circuit board, a first to a fifth stacking layers have been formed by using the first concentric-circle pattern 122 as an alignment target, and a sixth stacking layer 172 (i.e., the $M^{th}$ stacking layer) includes a sixth dielectric layer 172 and a sixth circuit layer 174 covering the sixth dielectric layer 172. Afterwards, as shown in FIG. 5 and FIG. 6B, a sixth through hole 180 is formed, which penetrates regions where an inner diameter of a first concentric circle 124a from the center of the second concentric-circle pattern 124 is orthogonally projected on the first to the sixth stacking layers and the substrate 110.

It should be noted that, while the through holes of each of the dielectric layers (e.g., the first to the fifth stacking layer) are formed by using the first concentric-circle pattern 122 as the alignment target, blind holes 182 can be formed on a position where the second via 118 of the second concentric-circle pattern 124 is orthogonally projected on the corresponding dielectric layer. Namely, the blind holes 182 are respectively formed on each of the dielectric layers (e.g., the first to the fifth stacking layer) corresponding to the second via 118. Therein, an outer diameter of the blind hole 182 is less an inner diameter of the first concentric circle 124a. Accordingly, since each of the stacking layers has already formed with the blind holes to reduce a total thickness of the dielectric layer, in the subsequent process, when it comes to form the sixth through hole 180, it is not required for the laser to burn through the dielectric layers with a thicker total thickness at once.

Next, the sixth through hole 180 may serve as an alignment target to perform a subsequent process to the sixth stacking layer 170. For example, the sixth through hole 180 may serve as an alignment target in a photolithography process to pattern the sixth circuit layer 174, so as to form a patterned circuit layer of the multi-layer circuit board. Or, the sixth through hole 180 may serve as an alignment target to form a sixth conductive hole on the sixth stacking layer 170.

Figure 6C:
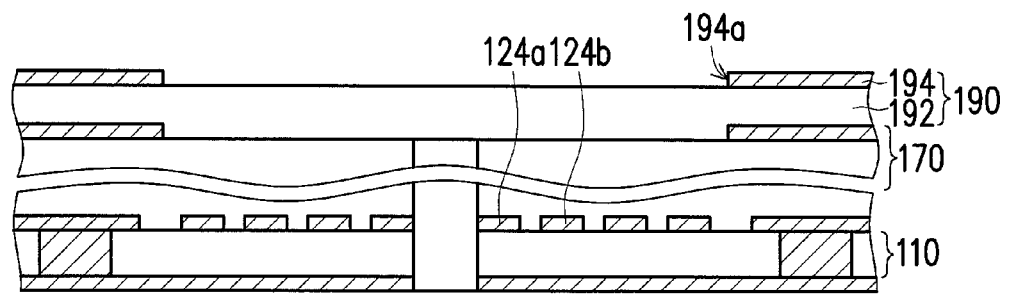
Figure 6D:
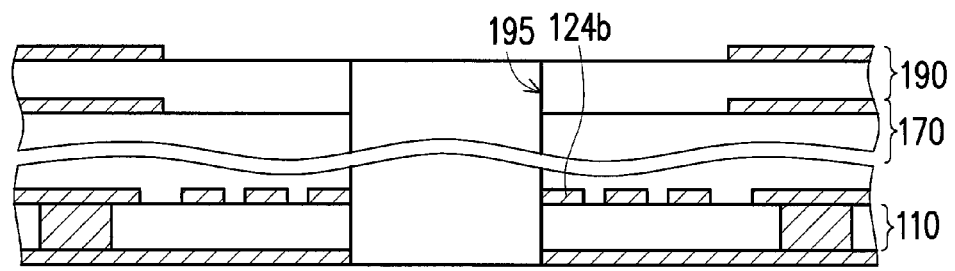

Referring to FIG. 6C, a seventh stacking layer 190 (i.e., a $(M+1)^{th}$ stacking layer) is formed on the sixth stacking layer 170. The seventh stacking layer 190 includes a seventh dielectric layer 192 and a seventh circuit layer 194 covering the seventh dielectric layer 194. Afterwards, as shown in FIG. 5 and FIG. 6D, a seventh through hole 195 is formed, which penetrates regions where an inner diameter of a second concentric circle 124b from the center of the second concentric-circle pattern 124 is orthogonally projected on the first to the seventh stacking layers and the substrate 110.

Next, the seventh through hole 195 may serve as an alignment target to perform a subsequent process to the seventh stacking layer 190. For example, the seventh through hole 195 may serve as an alignment target in a photolithography process to pattern the seventh circuit layer 194, so as to form a patterned circuit layer of the multi-layer circuit board. Or, the seventh through hole 195 may serve as an alignment target to form a seventh conductive hole on the seventh stacking layer 190. Therein, the seventh conductive hole connects the sixth conductive hole on the sixth stacking layer 170, and the conductive holes of each layer are connected to each other.

As described above, the sixth through hole 180 and the seventh through hole 195 may also be formed by $CO_2$ laser drilling or direct laser drilling. Similarly, in case $CO_2$ laser is used to form the sixth through hole 180 and the seventh through hole 190, openings 174a and 194a as shown in FIG. 6A and FIG. 6C need to be formed first, so as to respectively expose regions where the second concentric-circle pattern 124 is orthogonally projected on of the sixth dielectric layer 172 and the seventh dielectric layer 192 before proceeding to the subsequent drilling process. In case the direct laser drilling is used, the direct laser drilling may be directly performed without forming the openings 174a and 194a.

In view of above, the manufacturing method for the multi-layer circuit board of the invention forms the concentric-circle pattern on the surface of the substrate at the innermost, then the concentric-circle pattern is used as the alignment target in each of the stacking layers to form the corresponding alignment through hole, and then the alignment through hole of each layer is used to perform the subsequent process of the corresponding stacking layer, such as using the alignment through hole as the reference for alignment to form the patterned circuit layer and conductive hole of each layer. Therefore, the manufacturing method of the invention can reduce accumulation of alignment error through layers, and further reduce layer deviation in the multi-layer circuit board. Furthermore, since the conductive hole of each layer is formed by using the concentric-circle patterns formed in the same photolithography process as the alignment target, the circumstance of producing the conductive hole deviation due to accumulation of alignment error through layers is reduced. Therefore, the invention can indeed increase the alignment accuracy of the multi-layer circuit board and increase the wiring density of the circuit layer. In addition, the design of the conductive holes and the bonding pads can be miniaturized owing to the alignment accuracy. Even the pattern design with the single-side alignment accuracy up to less than 50 μm may be achieved.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A manufacturing method for a multi-layer circuit board, comprising:
    providing a substrate having a first via penetrating the substrate;
    forming a first patterned circuit layer on a surface of the substrate by using the first via as an alignment target, and the first patterned circuit layer including a first concentric-circle pattern surrounding the first via;
    forming a first stacking layer on the surface and covering the first patterned circuit layer, and the first stacking layer including a first dielectric layer and a first circuit layer covering the first dielectric layer;
    forming a first through hole, and the first through hole penetrating regions where an inner diameter of a first concentric circle from a center of the first concentric-circle pattern is orthogonally projected on the first stacking layer and the substrate;
    forming a second stacking layer on the first stacking layer, and the second stacking layer including a second dielectric layer and a second circuit layer covering the second dielectric layer; and
    forming a second through hole, and the second through hole penetrating regions where an inner diameter of a second concentric circle from the center of the first concentric-circle pattern is orthogonally projected on the second stacking layer, the first stacking layer and the substrate.

2. The manufacturing method for the multi-layer circuit board as claimed in claim 1, further comprising:
    after the first through hole is formed, patterning the first circuit layer by using the first through hole as an alignment target; and
    after the second through hole is formed, patterning the second circuit layer by using the second through hole as an alignment target.

3. The manufacturing method for the multi-layer circuit board as claimed in claim 1, further comprising:
    after the first through hole is formed, forming a first conductive hole on the first stacking layer by using the first through hole as an alignment target; and
    after the second through hole is formed, forming a second conductive hole on the second stacking layer by using the second through hole as an alignment target, and the second conductive hole connecting the corresponding first conductive hole.

4. The manufacturing method for the multi-layer circuit board as claimed in claim 1, wherein a method of forming the first through hole and the second through hole comprises $CO_2$ laser drilling.

5. The manufacturing method for the multi-layer circuit board as claimed in claim 4, further comprising:
    before the first through hole is formed, forming a first opening on the first circuit layer, and the first opening exposing a region where the first concentric-circle pattern is orthogonally projected on the first dielectric layer; and
    before the second through hole is formed, forming a second opening on the second circuit layer, and the first opening exposing a region where the first concentric-circle pattern is orthogonally projected on the second dielectric layer.

6. The manufacturing method for the multi-layer circuit board as claimed in claim 4, wherein a method of forming the first through hole comprises drilling from an outer surface of the first stacking layer towards the substrate, and a method of forming the second through hole comprises drilling from an outer surface of the second stacking layer towards the substrate.

7. The method of manufacturing the circuit board as claimed in claim 4, wherein a material of the first patterned circuit layer, the first circuit layer and the second circuit layer is copper.

8. The manufacturing method for the multi-layer circuit board as claimed in claim 1, wherein a method of forming the first through hole and the second through hole comprises direct laser drilling (DLD).

9. The manufacturing method for the multi-layer circuit board as claimed in claim 8, wherein a method of forming the first through hole comprises drilling from an outer surface of the first stacking layer towards the substrate, and a method of forming the second through hole comprises drilling from an outer surface of the second stacking layer towards the substrate.

10. The manufacturing method for the multi-layer circuit board as claimed in claim 1, wherein the substrate further comprises a second via penetrating the substrate, the first patterned circuit layer further comprises a second concentric-circle pattern surrounding the second via, and the manufacturing method for multi-layer circuit board further comprises:
    forming a $M^{th}$ stacking layer on the second stacking layer, and the $M^{th}$ stacking layer comprising a $M^{th}$ dielectric layer and a $M^{th}$ circuit layer covering the $M^{th}$ dielectric layer, wherein M is a positive integer greater than two;
    forming a $M^{th}$ through hole, and the $M^{th}$ through hole penetrating regions where an inner diameter of a first concentric circle from a center of the second concentric-circle pattern is orthogonally projected on the first to the $M^{th}$ stacking layers and the substrate;
    forming a $(M+1)^{th}$ stacking layer on the $M^{th}$ stacking layer, and the $(M+1)^{th}$ stacking layer including a $(M+1)^{th}$ dielectric layer and a $(M+1)^{th}$ circuit layer covering the $(M+1)^{th}$ dielectric layer; and
    forming a $(M+1)^{th}$ through hole, and the $(M+1)^{th}$ through hole penetrating regions where an inner diameter of a second concentric circle from the center of the second concentric-circle pattern is orthogonally projected on the first to the $(M+1)^{th}$ stacking layers and the substrate.

11. The manufacturing method for the multi-layer circuit board as claimed in claim 10, further comprising:

after the $M^{th}$ through hole is formed, patterning the $M^{th}$ circuit layer to form a $(M+1)^{th}$ patterned circuit layer by using the $M^{th}$ through hole as an alignment target; and after the $(M+1)^{th}$ through hole is formed, patterning the $(M+1)^{th}$ circuit layer to form a $(M+2)^{th}$ patterned circuit layer by using the $(M+1)^{th}$ through hole as an alignment target.

12. The manufacturing method for the multi-layer circuit board as claimed in claim 10, further comprising:

after the $M^{th}$ through hole is formed, forming a $M^{th}$ conductive hole on the $M^{th}$ stacking layer by using the $M^{th}$ through hole as an alignment target; and after the $(M+1)^{th}$ through hole is formed, forming a $(M+1)^{th}$ conductive hole on the $(M+1)^{th}$ stacking layer by using the $(M+1)^{th}$ through hole as an alignment target, and the $(M+1)^{th}$ conductive hole connecting the $M^{th}$ conductive hole.

13. The manufacturing method for the multi-layer circuit board as claimed in claim 10, wherein M is substantially equal to or grater than five.

14. The manufacturing method for the multi-layer circuit board as claimed in claim 10, wherein a method of forming the $M^{th}$ through hole and the $(M+1)^{th}$ through hole comprises $CO_2$ laser drilling or direct laser drilling (DLD).

* * * * *